United States Patent [19]

Howard

[11] Patent Number: 5,434,823
[45] Date of Patent: Jul. 18, 1995

[54] OUTPUT SIGNAL DRIVER

[75] Inventor: David W. Howard, Cherry Hinton, United Kingdom

[73] Assignee: Advanced Risc Machines Limited, Cambridge, United Kingdom

[21] Appl. No.: 294,343

[22] Filed: Aug. 23, 1994

[30] Foreign Application Priority Data

Sep. 30, 1993 [GB] United Kingdom ............... 9320176

[51] Int. Cl.6 ............................................... G11C 7/00
[52] U.S. Cl. ........................... 365/230.06; 365/189.02; 365/189.05
[58] Field of Search ....................... 365/230.06, 230.08, 365/230.02, 196, 189.02, 189.05

[56] References Cited

U.S. PATENT DOCUMENTS

| | | | |
|---|---|---|---|
| 5,258,951 | 11/1993 | Yu et al. ........................... | 365/189.02 |
| 5,287,310 | 2/1994 | Schreck et al. ................. | 365/189.05 |
| 5,305,284 | 4/1994 | Iwase ............................. | 365/198.05 |
| 5,329,489 | 7/1994 | Diefendorff ..................... | 365/189.05 |

Primary Examiner—David C. Nelms
Assistant Examiner—Tan Nguyen
Attorney, Agent, or Firm—Albert C. Smith

[57] ABSTRACT

An output signal driver is described in which a functional block 10, such as a random access memory, provides a data signal to one input of a multiplexer 26 and then via a buffer stage 24 to an output signal line 6. The other input of the multiplexer 26 receives a recirculated value from the output signal line 6. In operation, the buffer stage 24 is enabled as soon as the functional block 10 is enabled. A data valid signal dv indicating when the data signal from the functional block is ready for output is used to switch the multiplexer 26 from selecting the recirculated value to selecting the new data signal value. The output signal on the output signal line 6 is made to always have a defined state derived from the existing output signal level or, when it becomes available, the new data signal. Power wastage through the driving of spurious signals on the output signal line 6 is thus avoided.

13 Claims, 12 Drawing Sheets

OUTPUT SIGNAL DRIVER

BACKGROUND OF THE INVENTION

1. Field of the Invention

This invention relates to data handling systems having a driven output signal line.

2. Description of the Prior Art

Various known data handling apparatus and methods, such as microprocessors, memories and communications devices, have a need to drive output signal lines. It is known for performance and protection reasons to provide buffer stages between the output signal lines being driven and the circuitry generating the data signals to be output.

FIG. 1 of the accompanying drawings illustrates a data handling device 2 having a simple, conventional output signal driving circuit 4 driving a plurality of output signal lines 6 on an output bus 8. The output signal driving circuit 4 includes a functional block 10, such as a random access memory block, that serves to generate data signals on data lines 12 for output via the output bus 8.

The functional block 10 generates the data signals in response to various input signals (input1, input2). The functional block 10 is selected and enabled via an enable signal (in this case also serving as a select signal) on an enable line 14 that also passes (via an enable input "e") to each of a plurality of buffers 16 that are provided for the data signal lines 12. The buffers 16 serve to isolate the functional block 10 from the output bus 8 and provide a degree of power amplification for driving the relatively high capacitance output bus 8.

FIG. 2 of the accompanying drawings shows a timing diagram for various signals within the data handling device 2 of FIG. 1. The "select" signal switches state to enable the upper output signal driving circuit 4 of FIG. 1. This "select" signal enables the functional block 10 and the buffers 16. The output of the functional block 10 (FB1 Output) takes a finite amount of time to settle to its eventual data signal value. During this time spurious signals ("glitches,") are placed upon the data signal lines 12. Since the buffer circuits 16 are enabled by the "select" signal, this has moved them from a high impedance state to an active state and thus they serve to power amplify the spurious signals on the data signal lines 12 and pass this onto the output bus 8. Driving the output bus 8, which is of a relatively high capacitance, with spurious, rapidly changing signals via the output buffers 16 consumes a significant amount of circuit power. Furthermore, the circuitry elsewhere that is connected to the output bus 8 must be protected from the spurious signals that are temporarily present on the output bus 8.

FIG. 3 of the accompanying drawings illustrates an alternative arrangement to that of FIG. 1 (as used in the ARM600 integrated circuit produced by Advanced RISC Machines Limited) in which latching circuits 18 have been interposed between the functional block 10 and the buffers 16. The functional block 10 has an additional data valid output (dv) that is asserted when the data signals from the functional block 10 have settled to valid values. The data valid signal triggers the latching circuits 18 to latch the values input to the latching circuits. These latched values are then passed to the buffers 16.

FIG. 4 of the accompanying drawings illustrates a timing diagram for the circuit of FIG. 3 similar to that illustrated in FIG. 2. In this case, since the outputs of the functional block 10 are latched by the latching circuits 18, the data signals need only be asserted by the functional block 10 long enough for them to be latched by the latching circuits 18. Once the data signals are latched, the functional block 10 can resume a quiescent state in which it consumes less power. This circuit does not deal with the problem of spurious signals being output on the output bus 8.

FIG. 5 of the accompanying drawings illustrates a possible modification of the circuit of FIG. 3. In this case, the buffers 16 are not enabled by the "select" signal. Instead, the data valid signal is used to enable the buffers 16, the data valid signal passing through an enable latch 20. The enable latch 20 preserves the enable signal to the buffers 16 even when the functional block 10 returns to its quiescent state.

FIG. 6 of the accompanying drawings illustrates the timing of various signals within the circuit of FIG. 5. In this case, since the buffers 16 are not enabled until the data valid signal is asserted, no spurious signals are input to or output from the buffers 16. However, this arrangement has the disadvantage that a finite time (T) is needed between the data valid signal being applied to the buffers 16 and the buffers 16 being able to drive the output bus 8. The extra time delay this introduces is a performance disadvantage, e.g. an increase in memory access time.

SUMMARY OF THE INVENTION

An object of the invention is to address the above-mentioned problems.

Viewed from one aspect this invention provides apparatus for data handling having output signal driving means for driving an output signal line, said output signal driving means comprising:

(i) data signal generating means for generating a data signal to be output and a data valid signal indicating said data signal is ready for output, said data signal generating means being enabled by an enable signal;

(ii) a multiplexer for selecting one of said data signal and an output signal fed back from said output signal line to provide a buffer stage input signal, said multiplexer being responsive to said data valid signal to select said data signal; and (iii) a buffer stage switched from a high impedance state by said enable signal and, when enabled, responsive to said buffer stage input signal for driving said output signal line to a first voltage state or a second voltage state.

The invention provides that the buffer stage is enabled immediately so avoiding the full delay T illustrated in FIG. 6, whilst the feeding back of the output signal through the multiplexer to the input of the buffer stage until the data signal is ready prevents the buffer stage from outputting spurious signals and so wasting power. In this way, a typically 25 to 50% saving in power per access can be made over the circuits of FIG. 1 and FIG. 3 without incurring an extra performance limiting delay T of the circuit of FIG. 5.

It will be appreciated that the enable signal may be implicitly provided by other signals within the system rather than being provided as a discrete signal in its own right, e.g. a memory access address transition could be detected and used to trigger enabling of the data signal generating means and buffer stage.

It is desirable that positive measures should be taken to ensure that the output signal fed back from the output signal line maintains its level even when the apparatus is not enabled. This could be achieved in many different ways, e.g. the provision of an invertor with weak feedback on the output signal line (a "leaky" invertor). However, in preferred embodiments said multiplexer latches said output signal when said data valid signal indicates said data signal is not ready for output and said buffer stage is enabled by said enable signal.

In this way, the multiplexer is able to perform an additional function thereby avoiding the need fop providing circuit elements specifically fop the function of latching.

The buffer stage may be embodied in many different ways that yield tri-state behaviour. However, a particularly effective embodiment using a low number of circuit elements is one in which said buffer stage comprises a buffer invertor coupled to a first power supply rail via a first buffer isolating gate and to a second power supply rail via a second buffer isolating gate, said first buffer isolating gate and said second buffer isolating gate being switched to a conductive state by said enable signal.

It will be appreciated that the multiplexer performs the function of switching the buffer stage input signal between the data signal and the output signal fed back from the output signal line. This action is conveniently provided in embodiments in which said multiplexer comprises a data signal invertor and an output signal invertor, said data signal invertor and said output signal invertor having parallel connected outputs providing said buffer stage input signal, said data valid signal serving to switch on said data signal invertor and switch off said output signal invertor.

The switching on and switching off of the data signal invertor and the output signal invertor in a manner in which ensures effective isolation of the invertors and a low power consumption when they ape switched off is to provide isolating gates between the respective invertors and the first and second power supply rails.

In order to reduce the overall power consumption, it is desirable that said output signal invertor receives said fed back output signal at a high impedance input.

Ensuring that the fed back output signal is received at a high impedance input assists in reducing the power consumption when the buffer stage and the data signal generating means are disabled, since the output signal is continuously fed back duping this state.

A further advantageous power saving feature is that said data signal generating means asserts said data signal and said data valid signal for a predetermined period after which said data signal generating means switches to a quiescent state.

Providing the data signal generating means with a quiescent state has the result that when the data signal has been accessed and asserted, its continued output onto the output signal line can be left to the buffer stage and the multiplexer allowing the data signal generating means to adopt such a low power quiescent state.

It will be appreciated that the data signal generating means can take many different forms. However, in situations in which the invention is particularly suited said data signal generating means, when enabled, determines said data signal in dependence upon one or more input signals.

Such embodiments where the data signal generating means serves to process one or more input signals to determine the data signal particularly benefit from the buffering of the output signal lines from the data signal generating means for power consumption (i.e. processing takes a relatively long time and so spurious signals are produced for longer) and protection of the relatively delicate processing circuitry.

More particularly, the invention is especially suited to embodiments in which said data signal generating means comprises a memory circuit, said one or more input signals specify a memory address to be accessed and said data signal comprises a stored data signal.

The invention may be embodied as an individual output signal generating circuit with its buffering mechanism for attachment to an individual output signal line via the tri-state buffer stage. However, the need to use such tri-state buffer stages and provide a mechanism for individually enabling and disabling elements connected to the output signal line particularly arises when a plurality of output signal driving means are coupled to a common output signal line. An example of this would be the various functional blocks within a data processing system that are interconnected via a common bus to provide data transfer between the functional blocks under control of a bus controller.

In the case of a shared bus, the bus will typically have a greater physical size with a resulting higher capacitance making the need to avoid the output spurious data on the bus more important. Furthermore, an additional requirement that arises is that, when switching between which data signal generating means is enabled, an output signal conflict should not arise in which one buffer stage is attempting to drive the output signal line to a different signal level to another buffer stage. Such conflicts can consume considerable amounts of power and result in circuit damage. The mechanism of feeding back the output signal line value to the input of the buffer stage has the advantage that all the buffer stages that are connected to a common output signal line will initially adopt the signal level that is already present on the output signal line when they are enabled. Thus, an additional time delay needed to separate the enabling of differing buffer stages to avoid conflicts need not be provided.

It will be appreciated that the invention may be embodied as discrete components. However, the invention is particularly suited to being embodied as an integrated circuit.

Viewed from another aspect the invention provides a method of data handling including driving an output signal line, said method comprising the steps of:
 (i) generating a data signal to be output and a data valid signal indicating said data signal is ready for output, said generating of said data signal being enabled by an enable signal;
 (ii) selecting one of said data signal and an output signal fed back from said output signal line to provide a buffer stage input signal, said selecting being responsive to said data valid signal to select said data signal;
 (iii) switching a buffer stage from a high impedance state in response to said enable signal; and
 (iv) in dependence upon said buffer stage input signal, driving said output signal line to a first voltage state or a second voltage state.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 7:
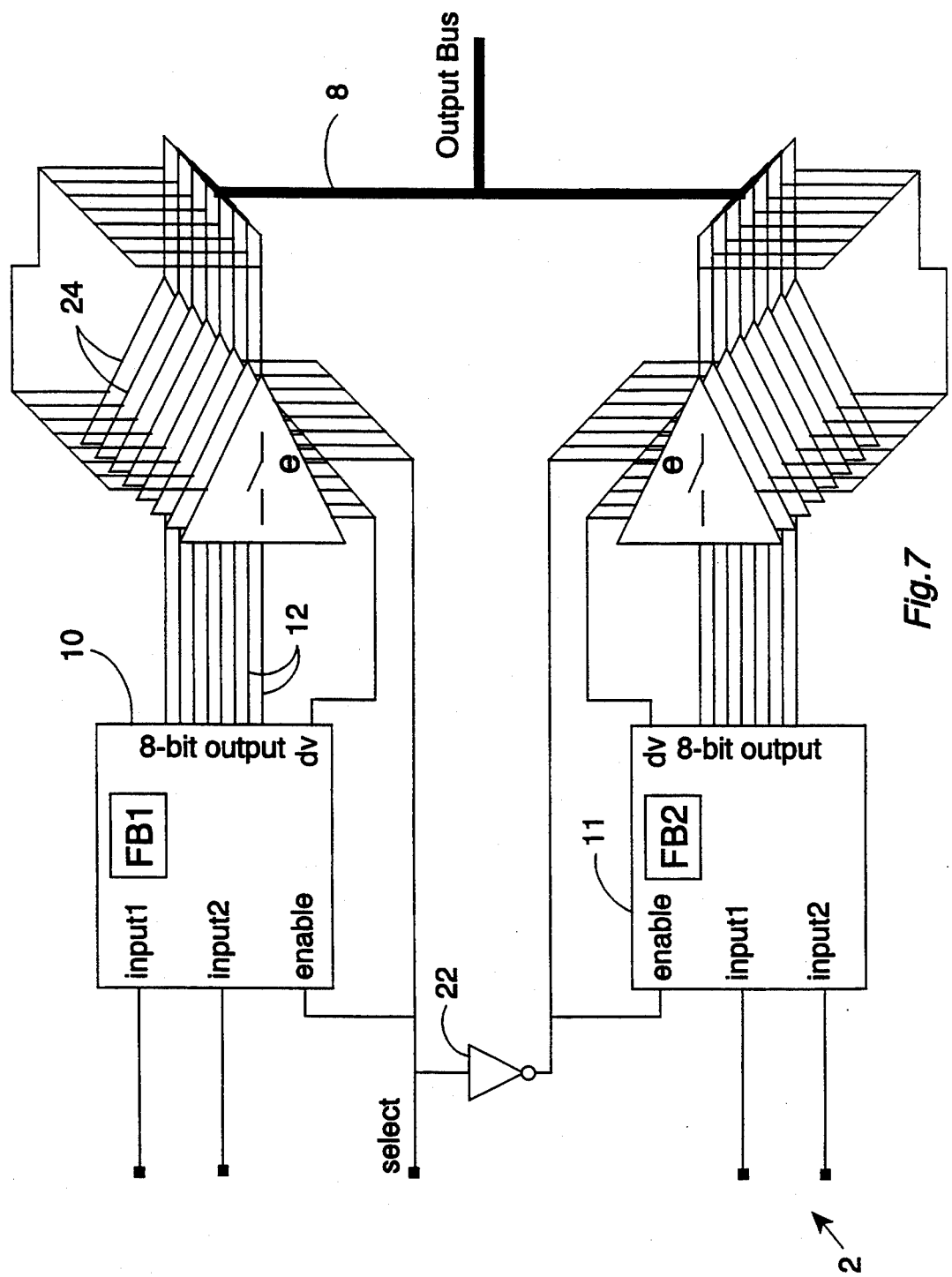
FIG. 7 illustrates a circuit arrangement in accordance with one embodiment of the invention.

The data handling device 2 of FIG. 7 comprises two functional blocks 10, 11 that have the form of random access memory blocks and serve as data signal generating means. The "select" signal enables one or other of these functional blocks 10, 11 via their "enable" inputs. The invertor 22 ensures that the functional blocks 10, 11 are enabled one at a time.

The functional blocks 10, 11 receive input signals (input1, input2) in the form of memory addresses to be accessed and after a finite access time produce an 8-bit output on the data signal lines 12.

The "select" signal is also fed to the combined buffer stage and multiplexer circuits 24 where it enables the buffer stages. Enabling the buffer stages at the same time as enabling the functional blocks 10, 11 has the result that there is no need to wait for the buffer stages to become operational once the data signals have been recovered from the memory and the data valid signal asserted.

In operation, an address to be accessed is input to the functional block 10 at the same time as the "select" signal enables the functional block 10 and the combined multiplexer and buffer stage circuits 24. The output signal present upon the output bus 8 is fed back to the input of the buffer stages and is accordingly maintained on the output bus until the data valid signal (dv) is asserted by the functional block 10 indicating that the 8-bit output from the functional block 10 is ready. At this time, the multiplexers within the combined multiplexer and buffer stage circuits 24 switch to select the data signals for output. The multiplexers also serve to latch the data signals and so after a predetermined period the data valid signal can be removed and the functional block 10 returned to a quiescent state.

Figure 8:
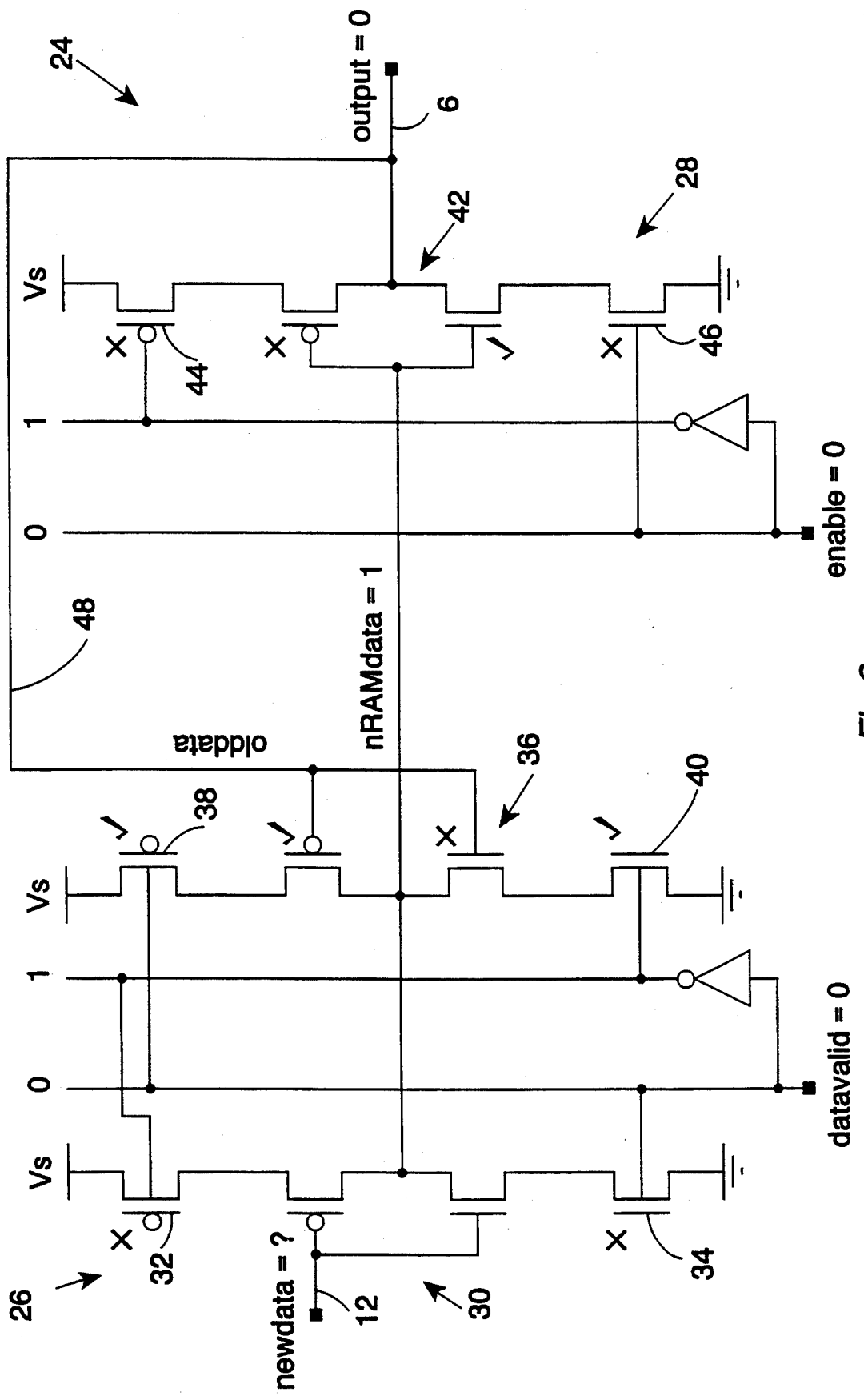
FIGS. 8 to 11 illustrate a buffer stage and multiplexer that form part of the circuit of FIG. 7 in more detail.

FIG. 8 illustrates the combined multiplexer and buffer stage circuit 24 in more detail. A multiplexer 26 receives a data signal upon data signal line 12 at gate electrode inputs of a data signal invertor 30 comprising two complimentary field effect transistors. First and second data signal invertor isolating gates 32, 34 are provided between the power rails and the data signal invertor 30. The multiplexer 26 also includes an output signal invertor 36 that receives a fed back output signal from the output signal line 6 at the gate electrode inputs of two complimentary field effect transistors. First and second output signal invertor isolating gates 38, 40 are provided between the output signal invertor 36 and the power rails.

The data valid signal dv from the functional block 10 is supplied to the gate electrodes of the isolating gates 32, 34, 38, 40 and used to switch the data signal invertor 30 and output signal invertor 36 on and off. The outputs of the data signal invertor 30 and the output signal invertor 36 are connected in parallel and alternately supply a buffer stage input signal (nRAMdata, i.e. the inverse of the data bit recovered from the memory) to the input of a buffer stage invertor 42.

The buffer stage invertor 42 has buffer stage invertor isolating gates 44, 46 switched by the enable signal that serve to isolate the buffer stage invertor 42 from the power supply rails until the buffer stage is enabled. The output from the buffer stage invertor 42 is supplied to the output signal line 6 which is in turn connected to the relatively high capacitance output bus 8. The output signal is fed back from the output signal line 6 by a feedback line 48 to the high impedance gate electrode inputs of the output signal invertor 36.

In the state illustrated in FIG. 8, the functional block 10 has not yet been selected and so both the enable signal and the data valid signal are low. In this state, the multiplexer 26 selects the fed back output signal from the output signal invertor 36 for supply to the buffer stage invertor 42. The output stage invertor isolating gates 38, 40 are conductive rendering the output signal invertor 36 operational and causing it to act as part of a latch for the output signal.

Figure 9:
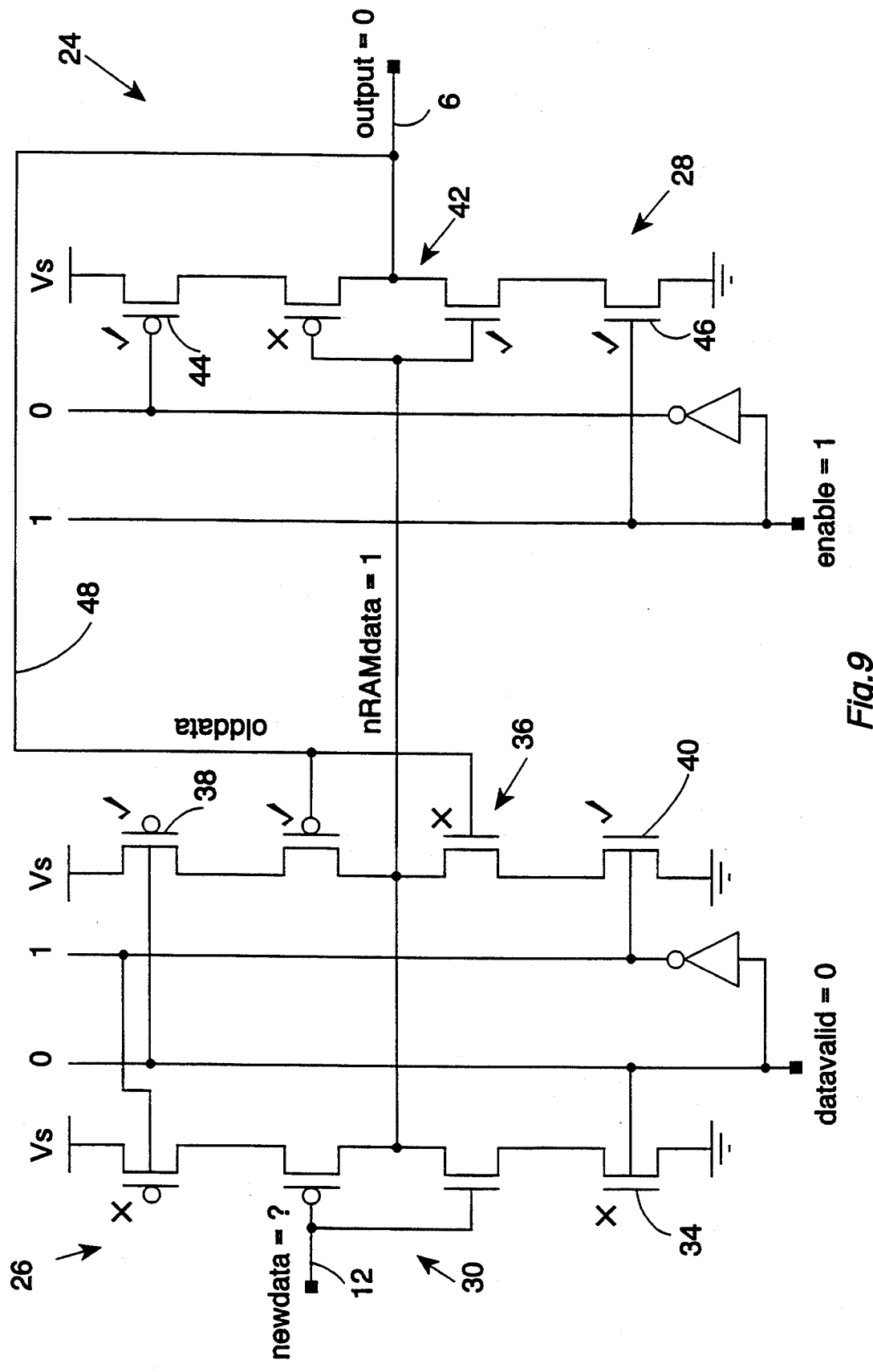

In FIG. 9, the "select" signal has been asserted that serves as the enable signal. Thus, the buffer stage invertor 42 is switched on by rendering the buffer stage invertor isolating gates 44, 46 conductive. The output signal invertor 36 is still switched on and providing the buffer stage input signal to drive the buffer stage invertor 42. Since the buffer stage input signal is fed back from the output signal line 6 (and inverted twice) the output stage invertor 42 has a consistent and predefined state such that it continues to drive the output signal line out to the value it already has. This avoids the appearance of spurious signal levels on the output signal line 6. In this case, the output signal line is driven to a value of 0.

Figure 10:
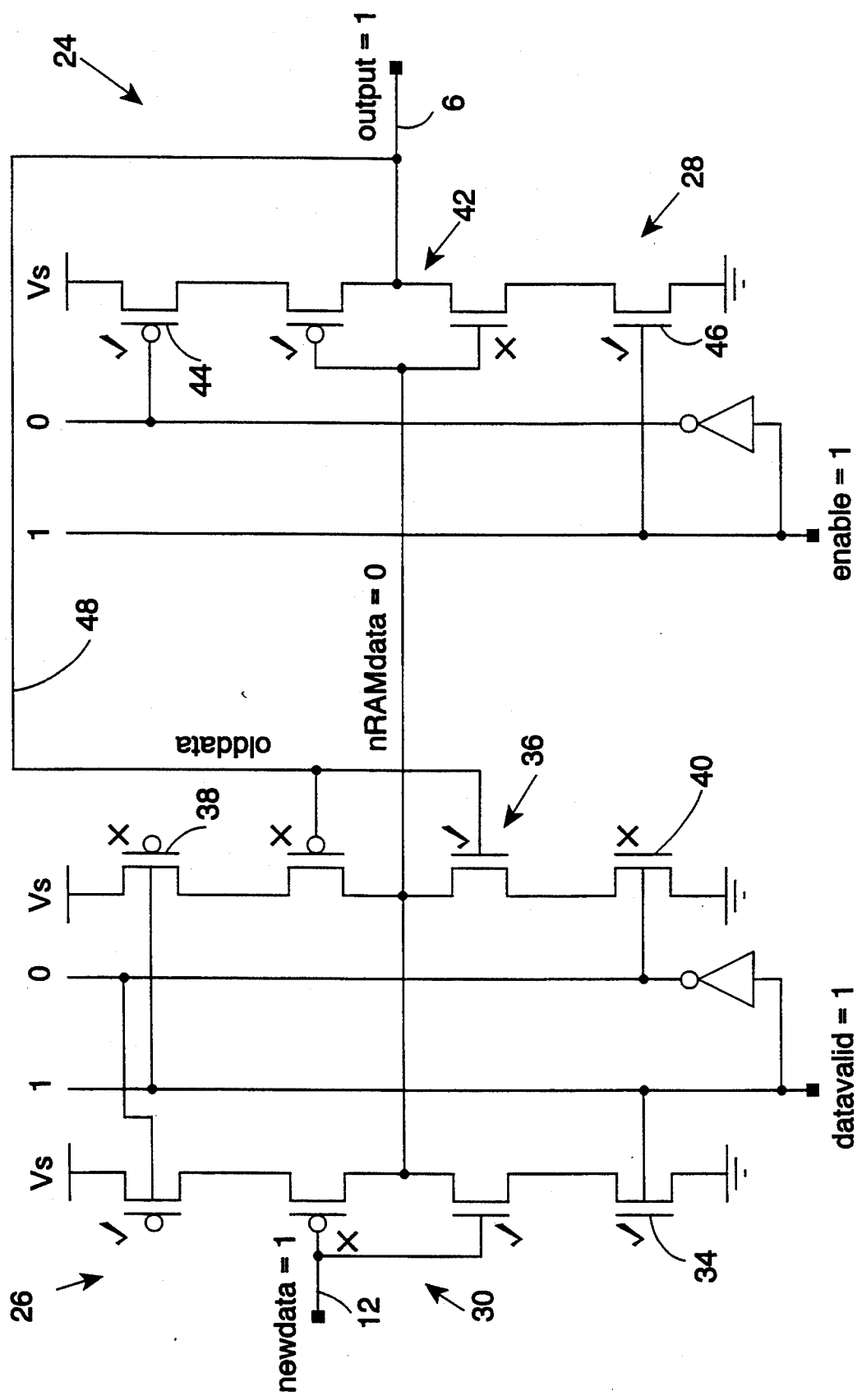

In FIG. 10, the data signal from the functional block 10 has become available as is indicated by the data valid signal becoming high. This causes the multiplexer 26 to switch off the output signal invertor 36 and switch on the data signal invertor 30 by rendering the data signal invertor isolating gates 32, 34 conductive. The output from the data signal invertor 30 is low since the data signal is high. The output from the data signal invertor 30 is supplied to the input of the buffer stage invertor 42 that is still switched on and this causes the buffer stage invertor 42 to output a high signal value. Since the data valid signal is not asserted until a steady data signal has been achieved, the switching of the output signal level takes place smoothly without the spurious signal levels that lead to excessive power consumption.

Figure 11:
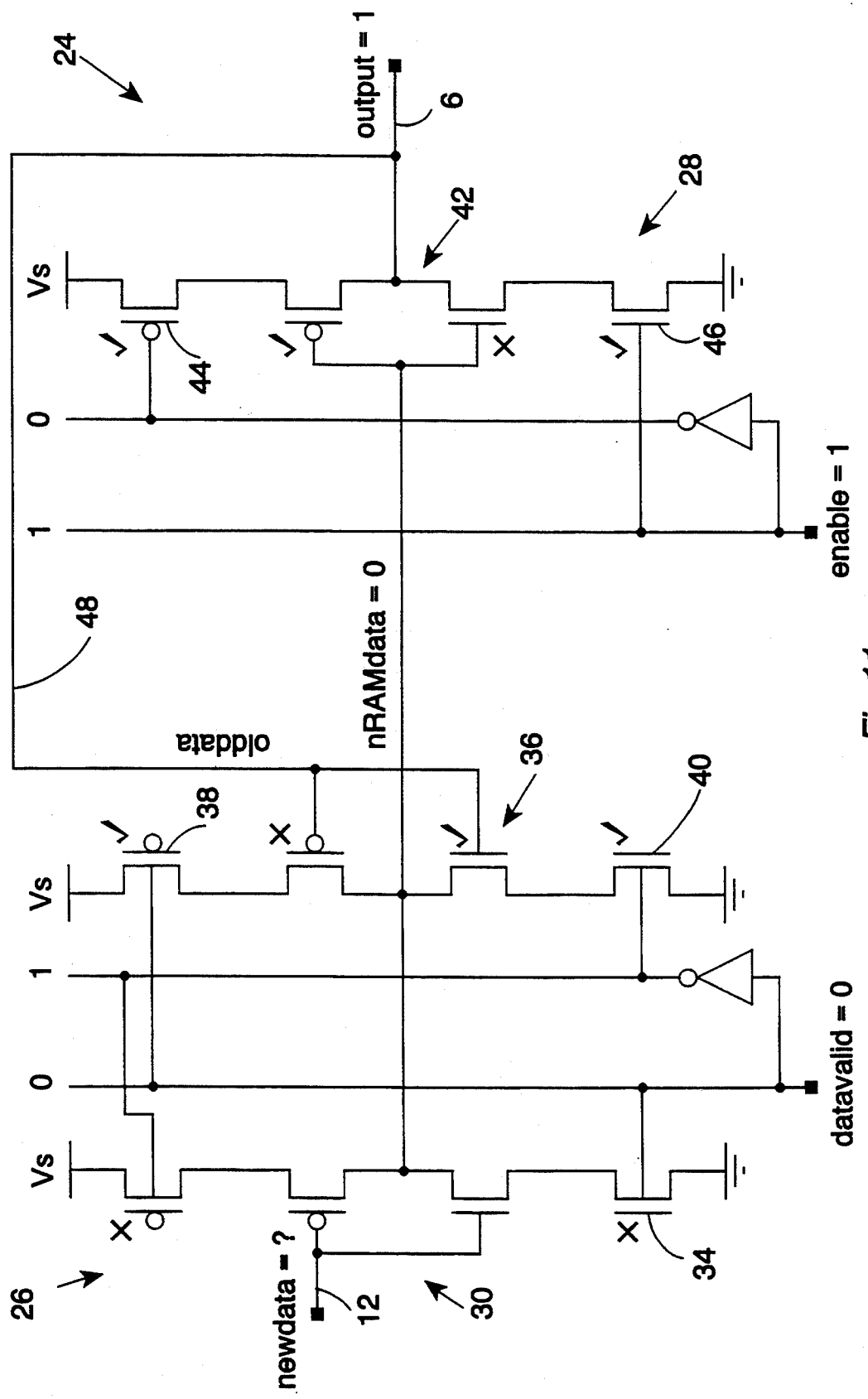

FIG. 11 illustrates the situation in which a predetermined time has elapsed since the data valid signal was asserted and the data valid signal returns to a low state corresponding to the functional block 10 being mowed into quiescent low power consumption state. When this happens, the data signal invertor 30 is switched off and the output signal invertor 36 switched back on. The input to the output signal invertor 36 is the fed back output signal on the output signal line 6. Thus, the buffer stage input signal remains constant and so there is no change in the output signal level.

In the case illustrated, the buffer stage invertor 42 is still switched on and driving the output signal line 6.

The buffer stage invertors in other output signal driving means connected to the common output signal line 6 will be switched off and so the buffer stage invertor 42 in this particular output signal driving means is responsible for driving the inputs to all of the output signal invertors 36 in the circuit arrangements connected to the common output signal line 6.

Figure 12:
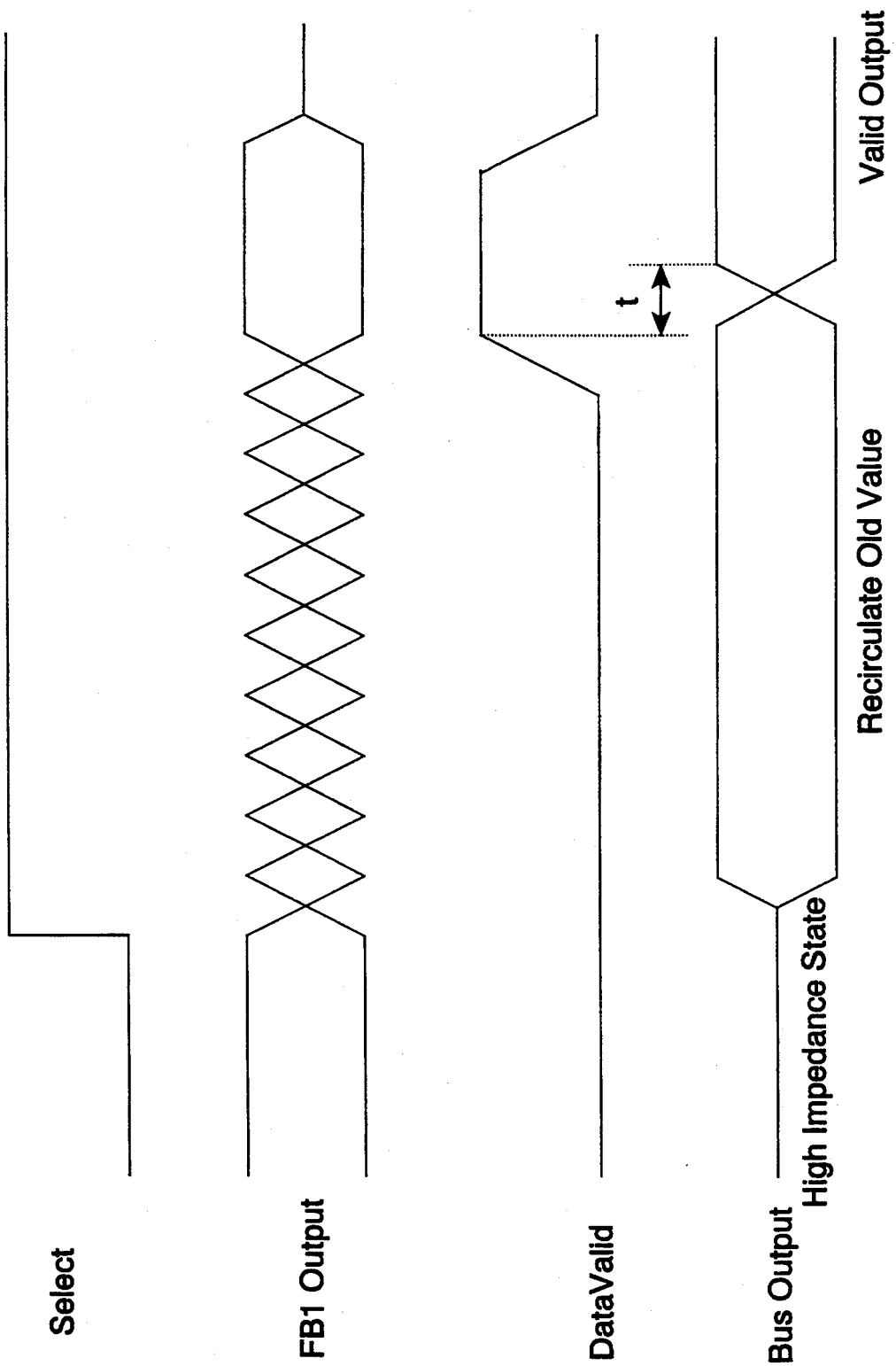
FIG. 12 illustrates a signal timing diagram fop the circuit arrangement of FIG. 7.

FIG. 12 illustrates a signal timing diagram for the circuit arrangement of FIGS. 7 to 11. When the "select" signal is asserted, the functional block output (data signal) assumes spurious values until the correct data has been read, whereupon it assumes a constant value. At this time, the data valid signal is asserted indicating that the data signal has assumed a constant value. The data valid signal is asserted for a predetermined period after which the functional block 10 ceases to output the data signal and returns to a quiescent state.

The bus output from the buffer stage invertor 42 first corresponds to the high impedance state of the buffer stage invertor 42 illustrated in FIG. 8. The output signal level at this stage will be well defined as either high or low and being driven by another buffer stage invertor. When the "select" signal enables the buffer stage, the buffer stage invertor 42 is switched on and serves to recirculate the existing output signal value and itself becomes responsible for holding the output signal line 6 at this level. This is a constant level and so power wastage through spurious signal levels being driven at the output is avoided.

Figure 1:
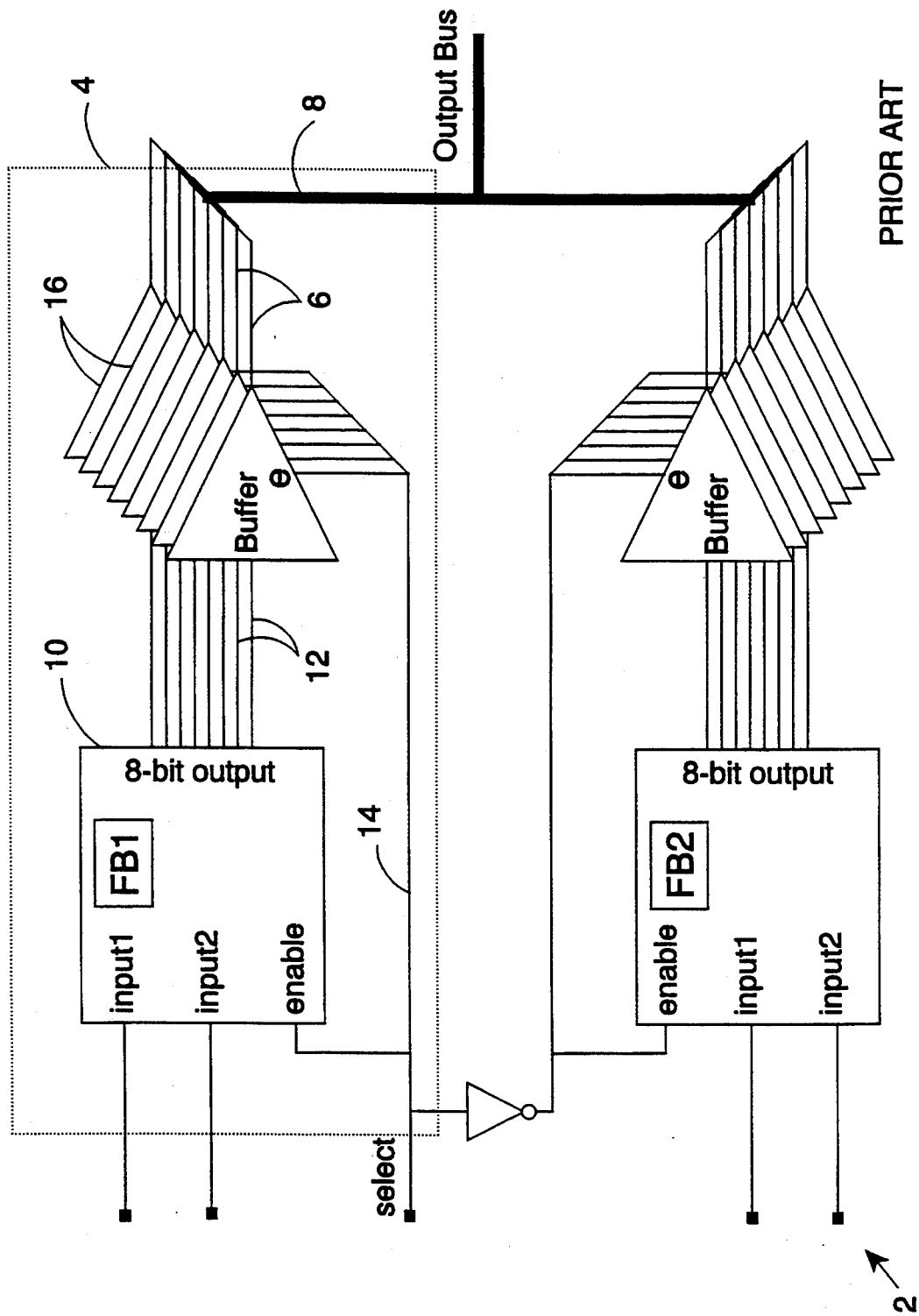
FIGS. 1 to 6 illustrate respective circuit arrangements and signal timing diagrams for three possible output signal line driving arrangements, each having associated disadvantages.
Figure 2:
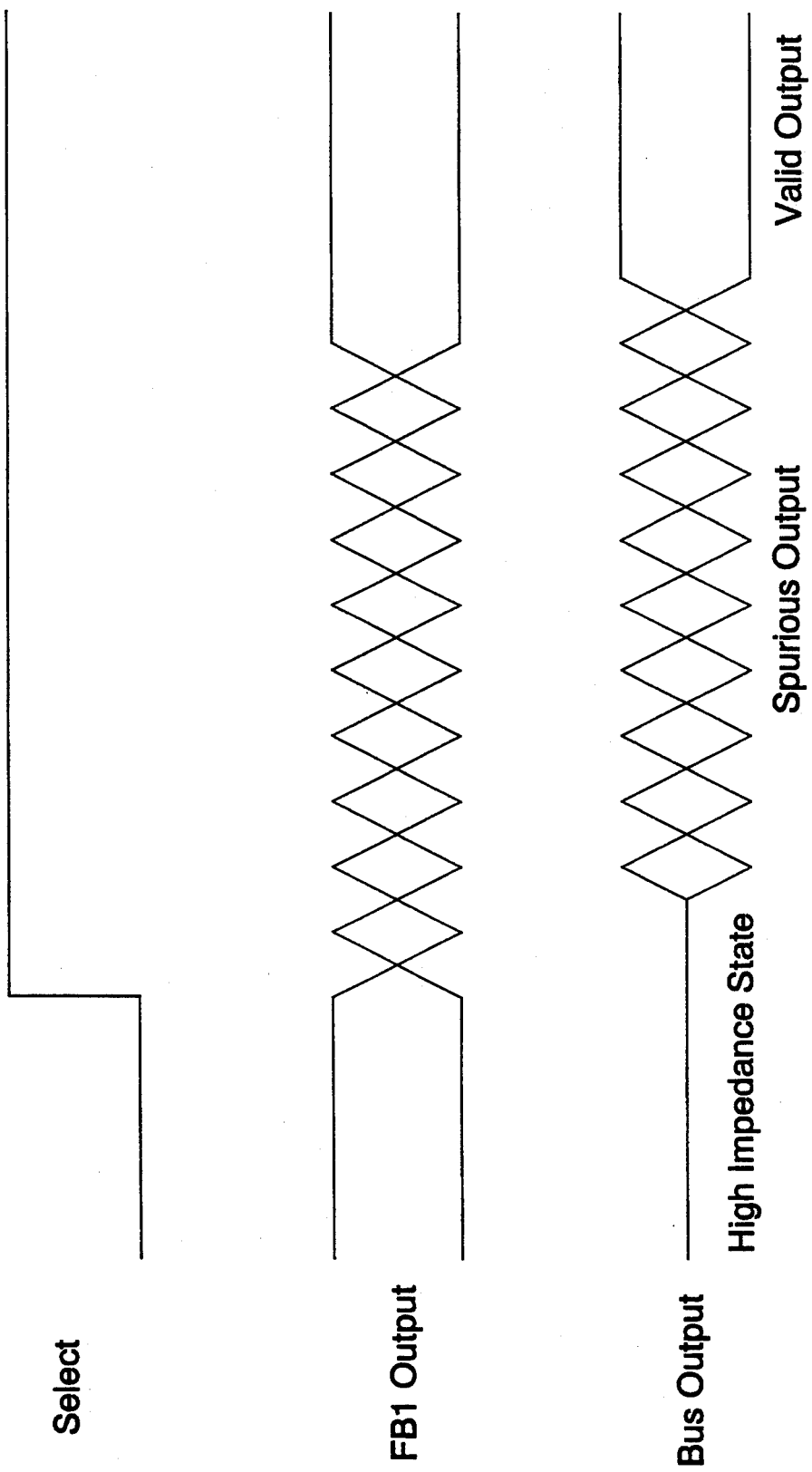
Figure 3:
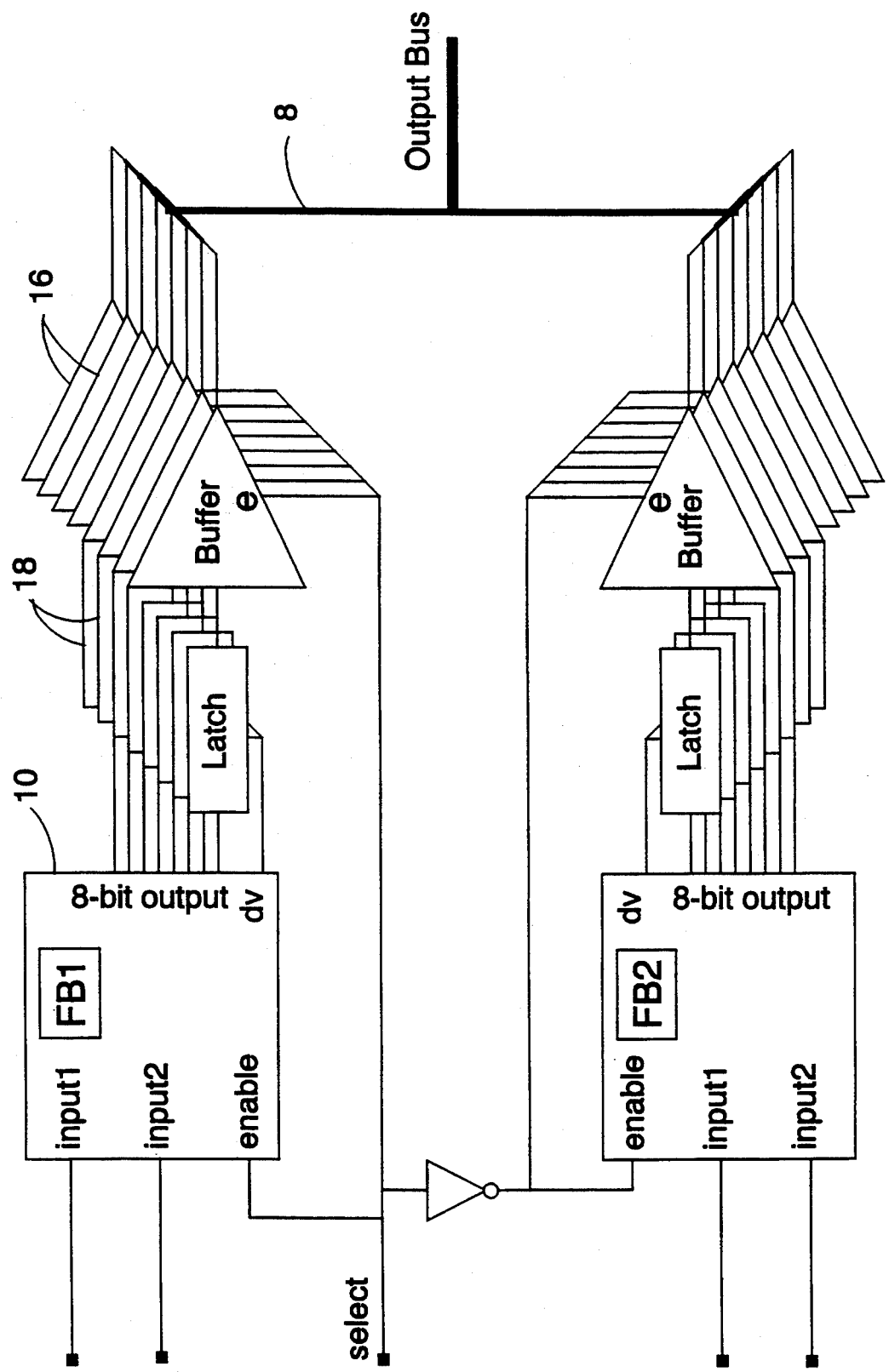
Figure 4:
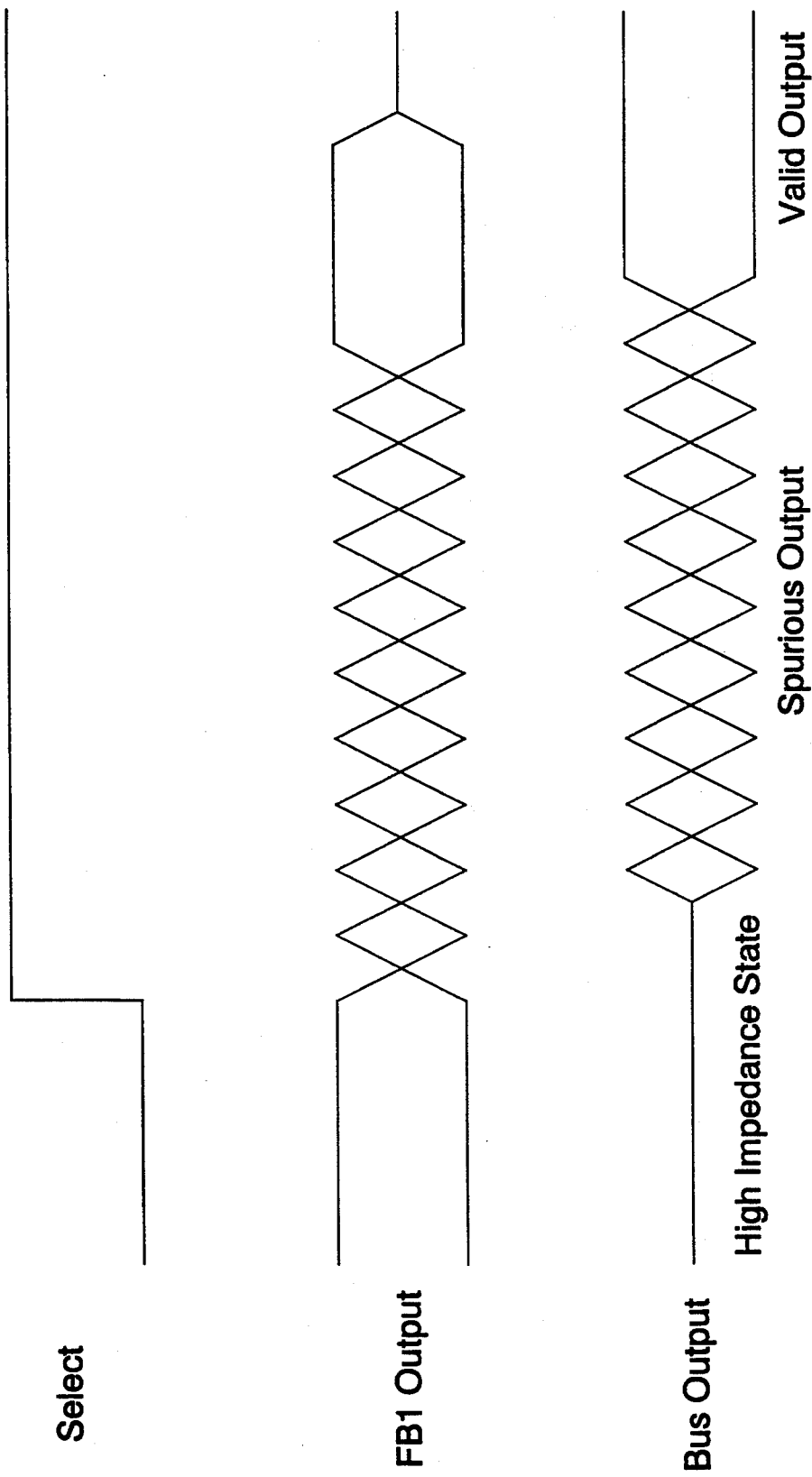
Figure 5:
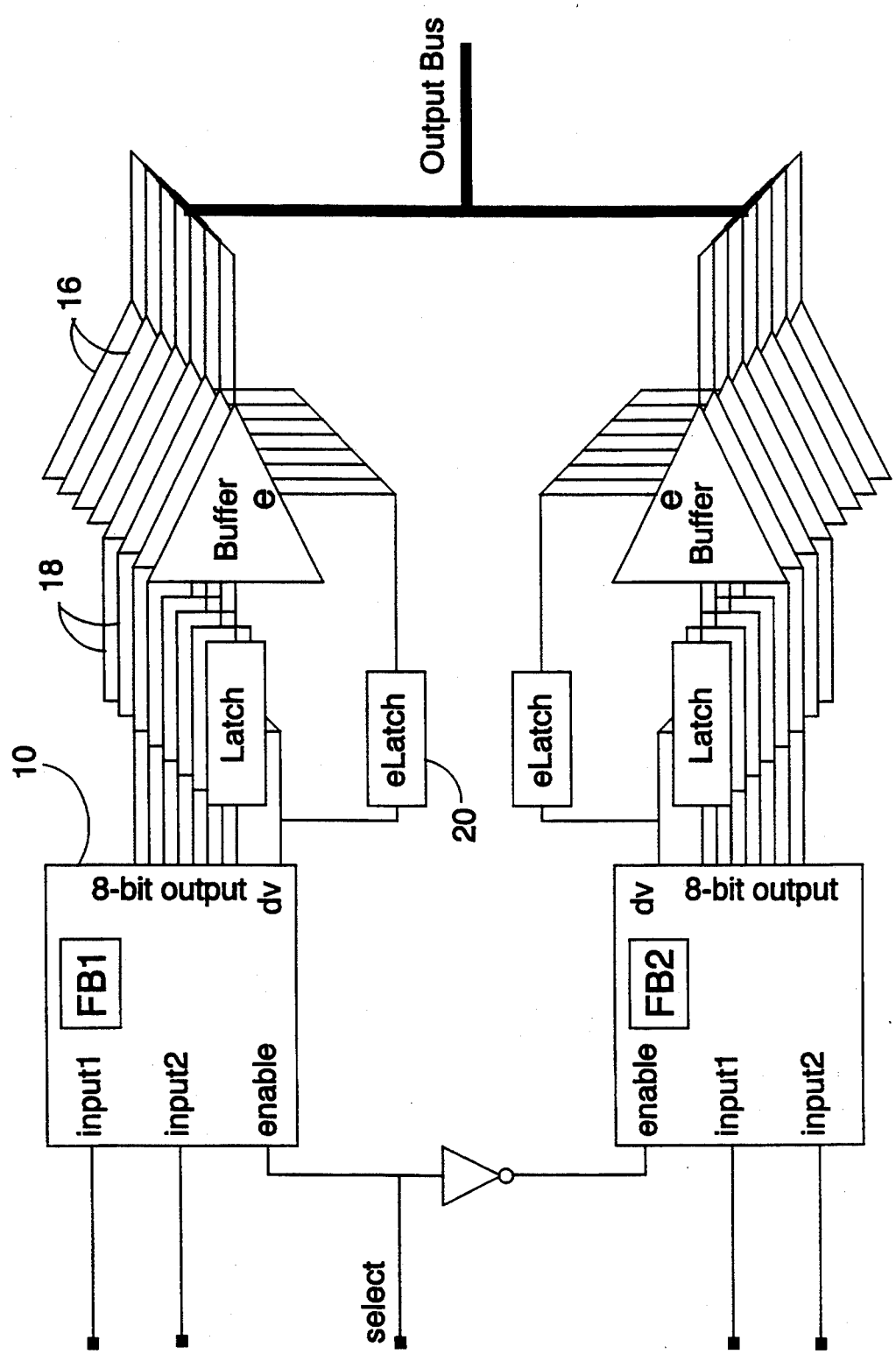
Figure 6:
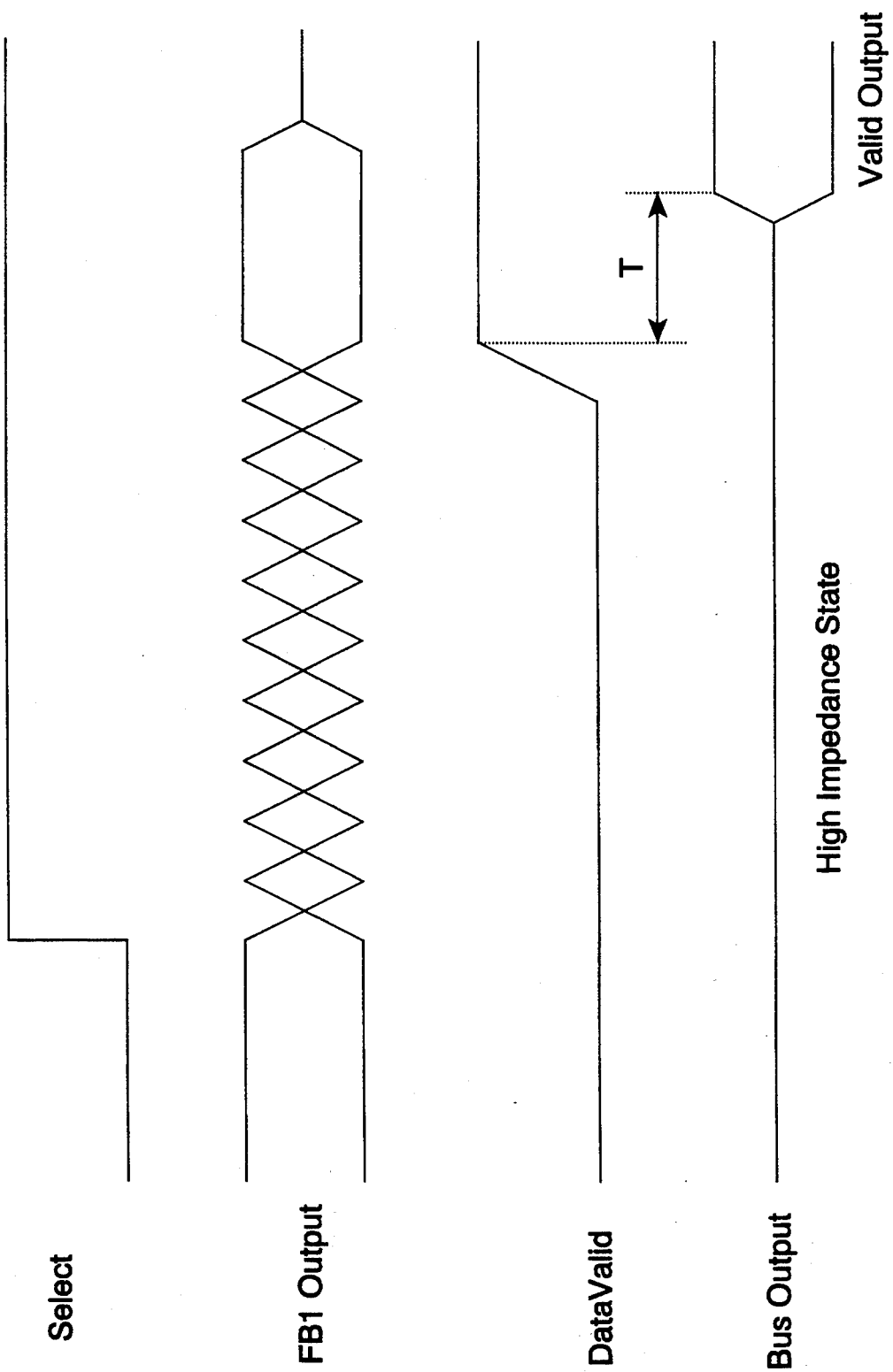

When the data valid signal is asserted, the multiplexer 26 switches to input the data signal from the functional block 10 to the buffer stage and the buffer stage outputs a corresponding signal level. Since the buffer stage is already switched on, the time t taken for the buffer stage to adopt this new signal level is reduced compared to that illustrated in FIG. 6. In this way, both power wastage through the driving of spurious values and the introduction of unnecessary delays to the output are avoided.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for data handling having output signal driving means for driving an output signal line, said output signal driving means comprising:
   (i) data signal generating means for generating a data signal to be output and a data valid signal indicating said data signal is ready for output, said data signal generating means being enabled by an enable signal;
   (ii) a multiplexer for selecting one of said data signal and an output signal fed back from said output signal line to provide a buffer stage input signal, said multiplexer being responsive to said data valid signal to select said data signal; and
   (iii) a buffer stage switched from a high impedance state by said enable signal and, when enabled, responsive to said buffer stage input signal for driving said output signal line to a first voltage state or a second voltage state.

2. Apparatus as claimed in claim 1, wherein said multiplexer latches said output signal when said data valid signal indicates said data signal is not ready for output and said buffer stage is enabled by said enable signal.

3. Apparatus as claimed in claim 1, wherein said buffer stage comprises a buffer invertor coupled to a first power supply rail via a first buffer isolating gate and to a second power supply rail via a second buffer isolating gate, said first buffer isolating gate and said second buffer isolating gate being switched to a conductive state by said enable signal.

4. Apparatus as claimed in claim 1, wherein said multiplexer comprises a data signal invertor and an output signal invertor, said data signal invertor and said output signal invertor having parallel connected outputs providing said buffer stage input signal, said data valid signal serving to switch on said data signal invertor and switch off said output signal invertor.

5. Apparatus as claimed in claim 4, wherein said buffer stage comprises a buffer invertor coupled to a first power supply rail via a first buffer isolating gate and to a second power supply rail via a second buffer isolating gate, said first buffer isolating gate and said second buffer isolating gate being switched to a conductive state by said enable signal and said data signal invertor is coupled to said first power supply rail via a first data signal invertor isolating gate and to said second power supply rail via a second data signal invertor isolating gate, said first data signal invertor isolating gate and said second data signal invertor isolating gate being switched to a conductive state by said data valid signal.

6. Apparatus as claimed in claim 4, wherein said buffer stage comprises a buffer invertor coupled to a first power supply rail via a first buffer isolating gate and to a second power supply rail via a second buffer isolating gate, said first buffer isolating gate and said second buffer isolating gate being switched to a conductive state by said enable signal and said output signal invertor is coupled to said first power supply rail via a first output signal invertor isolating gate and to said second power supply rail via a second output signal invertor isolating gate, said first output signal invertor isolating gate and said second output signal invertor isolating gate being switched to a non-conductive state by said data valid signal.

7. Apparatus as claimed in claim 4, wherein said output signal invertor receives said fed back output signal at a high impedance input.

8. Apparatus as claimed in claim 1, wherein said data signal generating means asserts said data signal and said data valid signal for a predetermined period after which said data signal generating means switches to a quiescent state.

9. Apparatus as claimed in claim 1, wherein said data signal generating means, when enabled, determines said data signal in dependence upon one or more input signals.

10. Apparatus as claimed in claim 9, wherein said data signal generating means comprises a memory circuit, said one or more input signals specify a memory address to be accessed and said data signal comprises a stored data signal.

11. Apparatus as claimed in claim 1, comprising a plurality of output signal driving means coupled to a common output signal line and selectively enabled by said enable signal.

12. Apparatus as claimed in claim 1, wherein said apparatus is formed as an integrated circuit.

13. A method of data handling including driving an output signal line, said method comprising the steps of:
 (i) generating a data signal to be output and a data valid signal indicating said data signal is ready for output, said generating of said data signal being enabled by an enable signal;
 (ii) selecting one of said data signal and an output signal fed back from said output signal line to provide a buffer stage input signal, said selecting being responsive to said data valid signal to select said data signal;
 (iii) switching a buffer stage from a high impedance state in response to said enable signal; and
 (iv) in dependence upon said buffer stage input signal, driving said output signal line to a first voltage state or a second voltage state.

* * * * *